United States Patent [19]

Furukawa et al.

[11] Patent Number: 4,993,696

[45] Date of Patent: Feb. 19, 1991

[54] MOVABLE STAGE MECHANISM

[75] Inventors: Motomu Furukawa, Kawasaki; Makoto Higomura; Masaru Ohtsuka, both of Yokohama; Hironori Yamamoto, Chigasaki; Shinkichi Ohkawa, Tsuchiura; Koichi Matsushita, Chiba; Yasuo Kawai, Shizuoka; Takao Kariya, Hino; Haruyuki Kusunoki, Abiko; Toshihiko Yamaura, Ushiku, all of Japan

[73] Assignee: Canon Kabushiki Kaisha, Tokyo, Japan

[21] Appl. No.: 125,566

[22] Filed: Nov. 25, 1987

[30] Foreign Application Priority Data

Dec. 1, 1986 [JP] Japan .................................. 61-284287
Dec. 2, 1986 [JP] Japan .................................. 61-287069
Dec. 2, 1986 [JP] Japan .................................. 61-287070
Jan. 8, 1987 [JP] Japan .................................. 62-1099

[51] Int. Cl.$^5$ ............................................. B23Q 1/04
[52] U.S. Cl. ........................................ 269/73; 269/59
[58] Field of Search ..................... 269/21, 55, 58, 59, 269/71, 73, 74

[56] References Cited

U.S. PATENT DOCUMENTS 4,505,464  3/1985  Chitayat .................................. 269/73

FOREIGN PATENT DOCUMENTS 3403765  8/1985  Fed. Rep. of Germany .

OTHER PUBLICATIONS

Japanese Society of Precision Engineering, "Positioning Characteristics of Vertical X-Y Stage for X-Ray Exposure Apparatus", Takahashi et al., Sep. 5, 1986, pp. 495–496; translation of p. 495, lines 1–21.

Primary Examiner—Steven Mottola
Attorney, Agent, or Firm—Fitzpatrick, Cella, Harper & Scinto

[57] ABSTRACT

A stage device usable, e.g., in an X-ray exposure apparatus, for moving a semiconductor wafer placed in a vacuum ambience and held by a wafer chuck, is disclosed. In the stage device, the wafer chuck holds the wafer so that the surface of the wafer onto which a circuit pattern is to be transferred is placed in a vertical plane, and the wafer chuck is moved vertically and horizontally for step-and-repeat exposure of the wafer. The device includes a guide mechanism, locking mechanism and a constant-tension spring mechanism, to thereby ensure high-accuracy movement of the wafer chuck in the vertical direction as well as high-precision positioning of the wafer. Further, in the stage device, a drive source producing a drive to move the wafer chuck is disposed in a vacuum ambience while, on the other hand, the supply of operating fluids to air bearing assemblies, for guiding the movement of the wafer chuck, is achieved by use of metal pipes coupled by rotary joints. The wafer chuck is resiliently supported by one of the air bearing assemblies, such that the wafer chuck can be moved in the vacuum ambience very accurately and without difficulties.

21 Claims, 9 Drawing Sheets

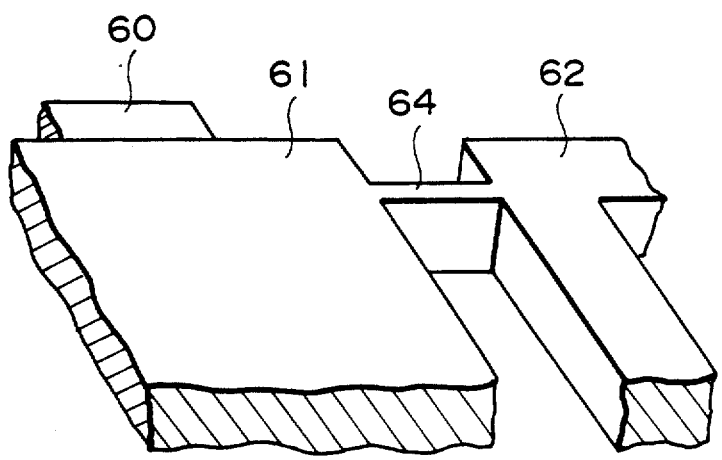
F I G. 6

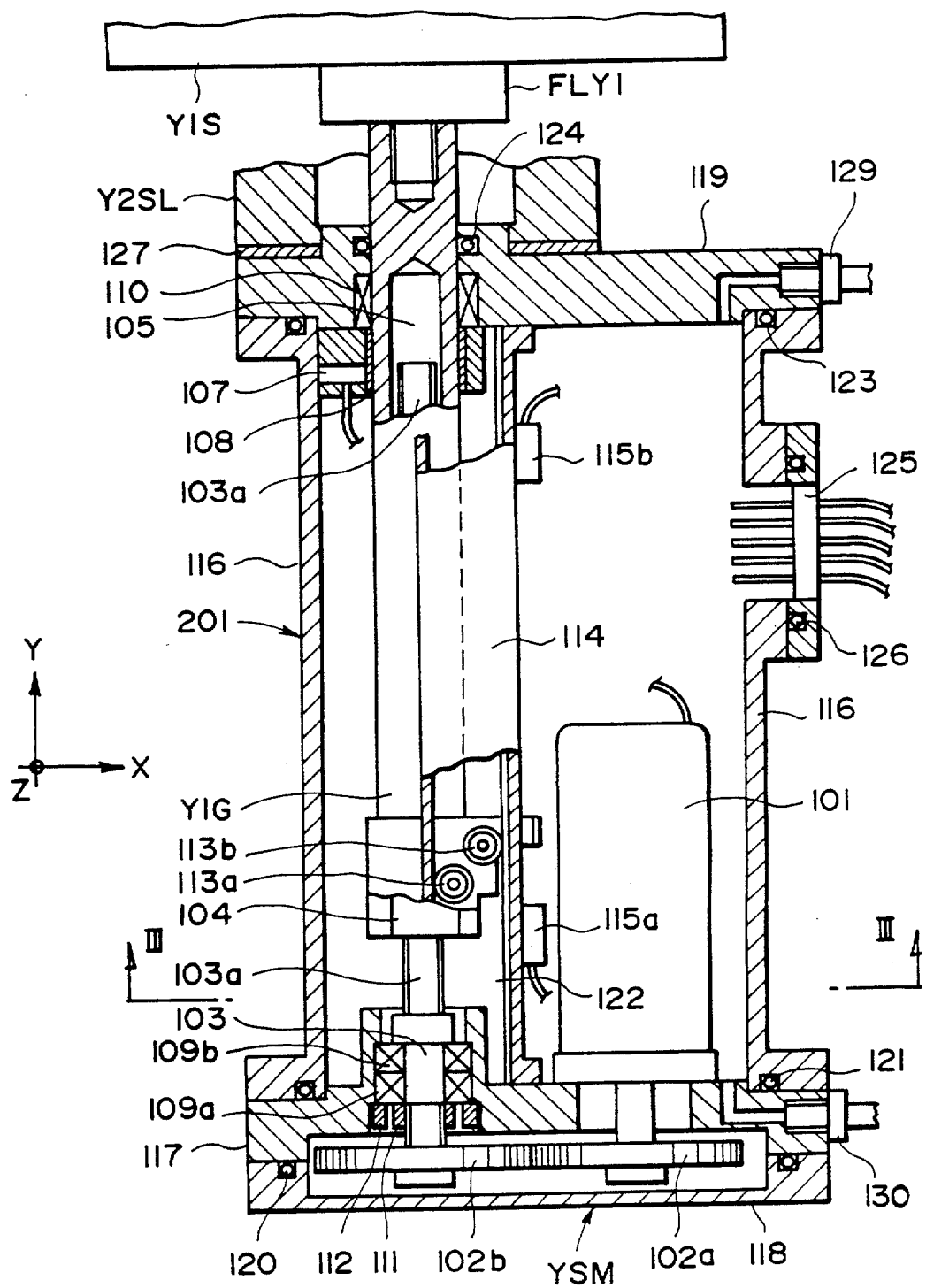
F I G. 9

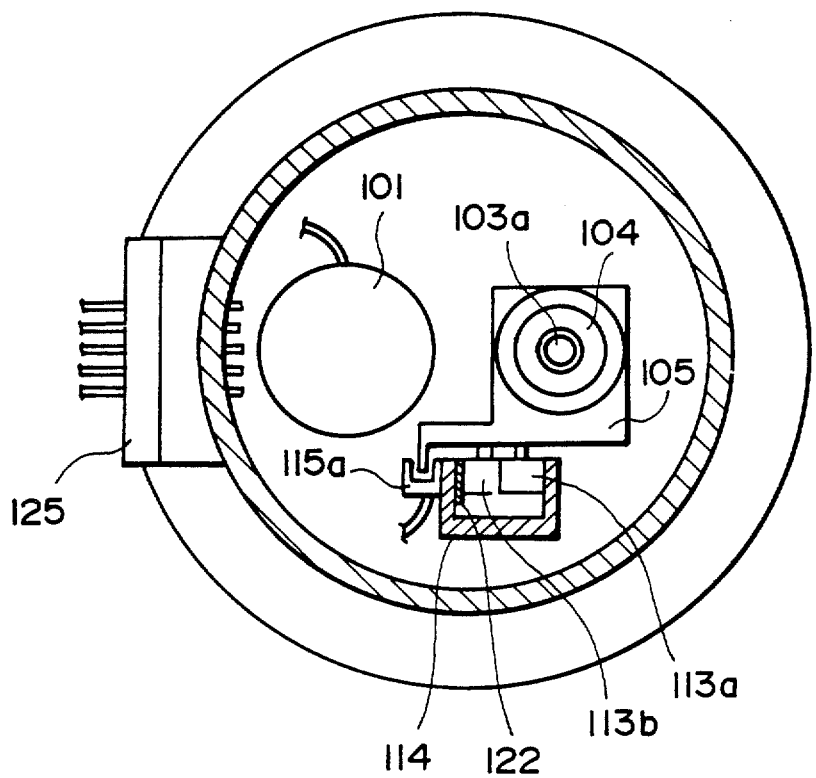
F I G. 10

MOVABLE STAGE MECHANISM

FIELD OF THE INVENTION AND RELATED ART

This invention relates to a stage device usable in lithographic exposure apparatuses or many types of measuring apparatuses, for moving a stage or table for carrying thereon a workpiece or otherwise. More particularly, the invention is concerned with a movable stage mechanism typically suitably applicable to an X-ray exposure apparatus, for moving a workpiece holder such as a wafer chuck in a vertical direction and a horizontal direction, wherein the workpiece holder is placed in a specific ambience and the is adapted to hold a workpiece, such as a semiconductor wafer, in a manner that the surface of the workpiece, such as a pattern transfer surface of the wafer, extends in a vertical plane.

Japanese Laid-Open Patent Application, Laid-Open No. Sho 60-178627, discloses a stage device usable in an X-ray exposure apparatus, for moving a wafer chuck placed in a specific ambience and carrying thereon a semiconductor wafer, in a manner that allows step-and-repeat exposure of the wafer. The stage device is arranged, on one hand, to hold a mask and a wafer and move them as a unit relative to an X-ray source which is a source of radiation energy for exposing the wafer and, on the other hand, to move the wafer relative to the mask so that a pattern formed on the mask is "printed" on different portions of the wafer in the step-and-repeat manner. Thus, the stage device disclosed in the aforementioned Japanese Patent Application allows the step-and-repeat exposure of the wafer to the mask pattern by use of X-rays.

Use of a fluid bearing assembly as a guide means in such a stage device involves many varieties of problems. One is concerned with the supply and exhaustion of an operating fluid to and from the fluid bearing assembly when it is placed in a vacuum ambience. For example, where a nylon tube is used for the fluid supply to the fluid bearing assembly, there occurs a problem of deterioration of the degree of vacuum in the ambience because nylon materials placed in high vacuum emit gases. Another problem is how to move a movable stage placed in vacuum. For example, where a movable stage disposed in a vacuum chamber is coupled with a driving mechanism placed outside the vacuum chamber by use of a rod, the coupling rod should have a substantial length which easily causes a disadvantage of flexure.

SUMMARY OF THE INVENTION

It is accordingly a primary object of the present invention to provide a stage device by which at least one of the above-described problems is solved.

It is another object of the present invention to provide an improved stage device wherein a movable stage or table can be moved precisely, without difficulties, even when the stage device is placed in a vacuum ambience.

It is a further object of the present invention to provide an improved stage device by which a movable stage or table can be displaced with a high positioning accuracy, in a vertical direction and a horizontal direction.

In accordance with one preferred form of the present invention, there is provided a stage device wherein a constant-tension spring mechanism is used which mechanism is operable in relation to the movement of a movable table or stage in a vertical direction and wherein a mechanical locking mechanism is provided to determine the stoppage of the movable stage. By this, the movable stage can be displaced with a high positioning accuracy, in the vertical direction.

In accordance with one aspect of the present invention, a movable stage is moved while being guided by two guide bars. In order to ensure smooth movement of the movable stage with certainty, a flexible structure is provided so as to couple the two guide bars with one another or to couple the movable stage with one of the guide bars. This is very effective particularly in a case where the parallelism between the two guide bars is damaged due to a dimensional error caused during machining or assembling or due to heat or vibration, and in a case where the interval between the two guide bars does not exactly correspond to the interval between bearing assemblies, provided for the guide bars, which interval is determined by a coupling plate provided therebetween. Namely, the flexible structure according to this aspect of the present invention can absorb any deformation.

In accordance with another aspect of the present invention, metal pipes are used for the supply and/or the exhaustion of an operating fluid, in order to practically allow use of a fluid bearing assembly in a vacuum ambience. Two adjacent pipes are coupled with each other by a joint which is arranged to allow swingable movement of one of the pipes relative to the other.

Further, in accordance with another aspect of the present invention, a drive source for moving a movable stage can be disposed within a vacuum ambience in which the stage device is placed. This assures reduction of adverse effects of flexure of a driving rod and also allows reduction in size of the stage device.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a fragmentary view showing a portion of the guide mechanism.

FIG. 9 is a sectional view showing details of a feeding mechanism usable in the stage device of the FIG. 1 embodiment.

FIG. 10 is a sectional view of the feeding device, taken on a line III—III in FIG. 9 and as viewed in the direction of the arrows.

DESCRIPTION OF THE PREFERRED EMBODIMENTS

Figure 1:
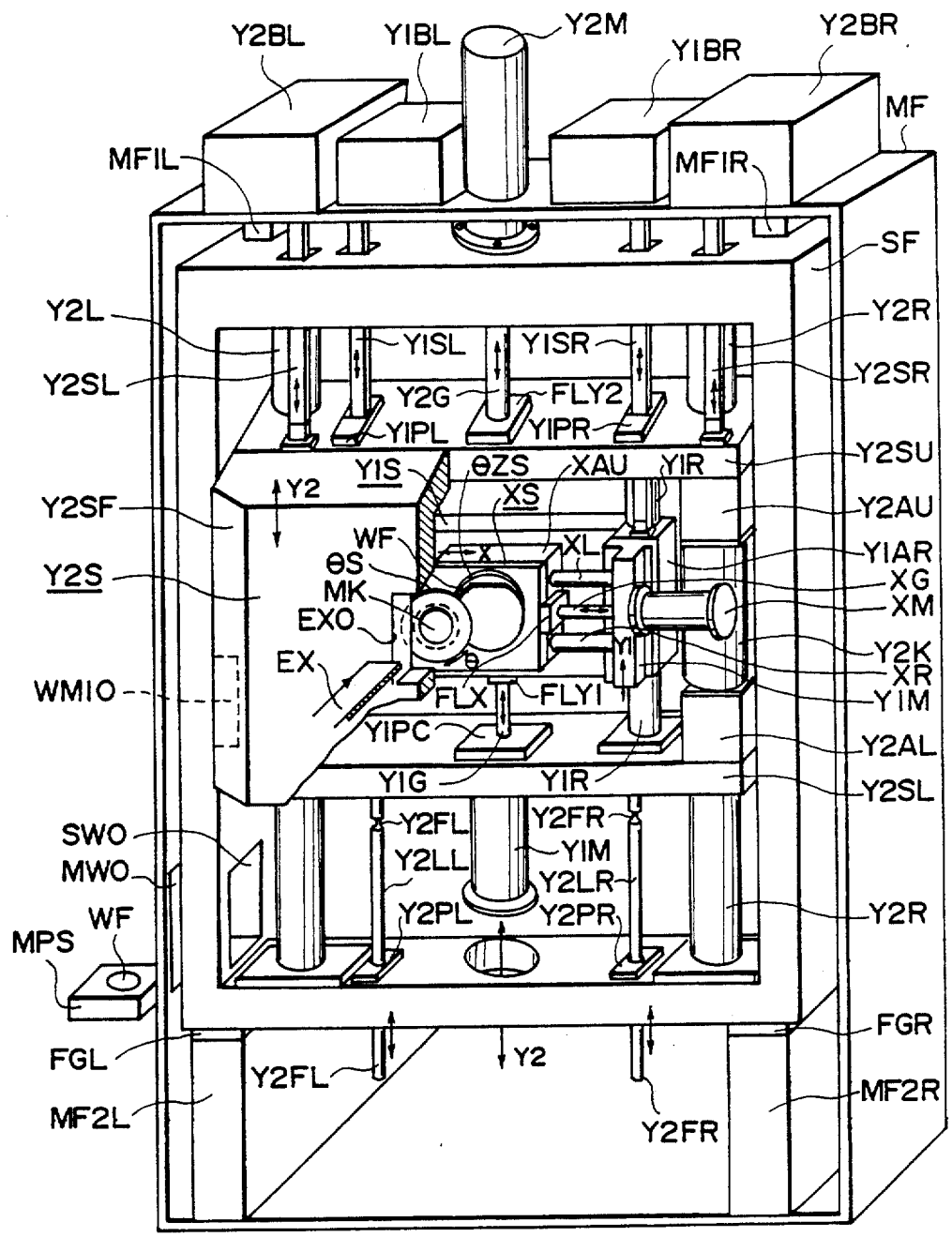
FIG. 1 is a perspective view schematically showing a stage device according to one embodiment of the present invention, wherein the stage device is incorporated into an X-ray exposure apparatus.

Referring first to FIG. 1, there is shown a stage device according to one embodiment of the present invention. The stage device includes a main frame MF having front and rear covers, not shown. The main frame MF is fixedly disposed with respect to the earth, and the inside space of the main frame is evacuated to a certain vacuum or is filled with a particular gas or gases. A secondary frame SF is suspended from an upper portion of the main frame MF by means of support members MF1R and MF1L. Also, the secondary frame SF abuts with a light pressure against rubber members FGR and FGL which are fixedly mounted to support members MF2R and MF2L, respectively, provided at a lower portion of the main frame MF. The rubber members FGR and FGL are provided so as to prevent vibration and lateral shift or dislocation of the secondary frame SF. A driving mechanism Y2M is fixedly mounted to the secondary frame SF and includes a cylinder, a motor and a driving rod denoted at Y2G in FIG. 1. The driving rod Y2G has one end thereof coupled to an upper plate Y2SU of a stage Y2S which is movable vertically, namely in Y-axis directions in FIG. 1.

The stage Y2S includes the upper plate Y2SU, a lower plate Y2SL, a front plate Y2SF and otherwise. The stage Y2S is arranged to be guided by a pair of shafts Y2R and Y2L and moved vertically (upwardly and downwardly) within the secondary frame SF by the upward and downward movement of the driving rod Y2G, responsive to a drive from a driving mechanism Y2M. A pair of gas or air bearing assemblies Y2AU and Y2AL are provided in relation to the shaft Y2R. These air bearing assemblies Y2AU and Y2AL are fixed to the upper and lower plates Y2SU and Y2SL of the stage Y2S, respectively. A barrel member Y2K is provided between the two air bearing assemblies so as to couple them with each other. A similar bearing arrangement is provided in relation to the other shaft Y2L. Thus, the movement of the stage Y2S is guided by means of the shafts Y2R and Y2L and the above-described air bearing assemblies. The inside of each air bearing assembly such as at Y2AU is isolated from the outside vacuum ambience by suitable means such as a labyrinth seal.

Denoted at Y2BR and Y2BL are constant-tension spring mechanisms of a known type which are fixedly mounted to the top of the main frame MF. These spring mechanisms Y2BR and Y2BL include steel belts Y2SR and Y2SL, respectively, for connecting the movable stage Y2S to the spring mechanisms Y2BR and Y2BL. The spring mechanisms Y2BR and Y2BL each operate to apply a constant force (tension) to the belts Y2SR or Y2SL in a direction winding up the corresponding belts Y2SR and Y2SL. Thus, these spring mechanisms function as a "weight" for balancing the gravity applied to the stage Y2S. Namely, the spring mechanisms Y2BR and Y2BL are effective to reduce the load to the driving mechanism Y2M at the time of upward and downward movement of the stage Y2S. Denoted at Y2LR and Y2LL are supporting bars which are fixedly coupled to the lower plate Y2SL of the stage Y2S and which are disposed symmetrically with respect to the driving shaft Y2G, for selective locking stage Y2S. Denoted at Y2PR and Y2PL are electro-mechanical locking mechanisms having piezoelectric elements or otherwise, for selectively gripping the supporting bars Y2LR and Y2LL, respectively, each at a predetermined pressure after the stage Y2S is stopped, thereby to lock the stage Y2S. Details of the locking mechanisms will be described later. By locking the stage Y2S by means of the locking mechanisms, the stage Y2S can be held at a desired position with respect to the vertical direction (Y-axis direction). Narrow portions Y2FR and Y2FL formed on the supporting bars Y2LR and Y2LL, respectively, are effective to flexibly absorb any dislocation of the stage Y2S with respect to the shafts Y2R and Y2L at the time of locking.

Another movable stage Y1S is accommodated in the stage Y2S. A driving mechanism Y1M for moving the stage Y1S is fixedly mounted to the lower plate Y2SL of the stage Y2S. The driving mechanism Y1M is arranged to move a rod Y1G upwardly and downwardly to thereby move the stage Y2S vertically (in the Y-axis direction) along guide shafts Y1R and Y1L (see FIG. 4). Details of the driving mechanism Y1M will be described later. Denoted at Y1AR is a gas or air bearing assembly which is similar to the bearing assembly Y2AU. As in the case of the stage Y2S, the stage Y1S is provided with a pair of constant-tension spring mechanisms Y1BR and Y1BL fixedly mounted to the top of the main frame MF and a pair of steel belts Y1SR and Y1SL, one end of each belt being fixedly secured to the stage Y1S. The constant-tension spring mechanisms Y1BR and Y1BL each operate to apply a constant tension force to the corresponding one of the steel belts Y1SR and Y1SL in a direction winding up the corresponding belt. Thus, the spring mechanisms function as a "weight" for balancing the load applied to the stage Y1S. This allows reduction in size of the driving mechanism Y1M for upwardly and downwardly moving the stage Y1S.

Denoted at Y1PC, Y1PR and Y1PL are locking mechanisms similar to those described hereinbefore, each mechanism having a piezoelectric device. The locking mechanisms Y1PC, Y1PR and Y1PL cooperate to selectively lock the stage Y1S to the stage Y2S. Thus, once the stage Y1S is locked, the movement of the stage Y2S causes integral movement of the stage Y2S. Namely, the stages Y1S and Y2S can move as a unit.

A third stage XS is movably supported by the stage Y1S. The stage XS is movable horizontally along an X-axis. A driving mechanism XM for moving the stage XS is fixedly mounted to a side portion Y1M of the stage Y1S. The driving mechanism XM is adapted to move its driving rod XG leftwardly and rightwardly, to thereby move the stage XS horizontally (in the X-axis direction) along a pair of guide shafts XL and XR. A coupling mechanism FLX is provided to flexibly couple the rod XG with the stage XS, thereby to absorb any dislocation of the stage XS with respect to the shafts XL and XR which are fixedly mounted to the stage Y1S. Similar coupling mechanisms FLY1 and FLY2 are provided for the stages Y1S and Y2S, respectively. A gas or air bearing assembly XAU of a type similar to that described hereinbefore is provided on the shaft XL. A similar bearing assembly is provided on the shaft XR. Also, while not shown in the drawing, a locking mechanism having a piezoelectric device and a supporting bar formed with a narrow portion, such as described hereinbefore, is provided at a position on the opposite side of the shaft XG. The stage XS carries thereon a movable stage θZS which is rotatable about an axis Z (i.e. in θ directions) and is movable along the Z-axis. The stage θZS is adapted to hold, by attraction, a semiconductor wafer WF onto which a circuit pattern is to be printed.

At a position opposed to the wafer WF held by the stage θZS, another rotatable stage θS having a ring-like shape is mounted to the inside surface of the front plate Y2SF of the stage Y2S. The stage θS is adapted to hold, by attraction, a mask MK on which a circuit pattern is formed.

The front plate Y2SF has an opening EXO formed therein for allowing passage of wafer exposing radiation, denoted at EX, such as X-rays, electron beams, ion beams or otherwise. Also, the front plate Y2SF is formed with another opening WMIO through which the mask MK and/or the wafer WF is introduced into the stage Y2S and unloaded out of the stage Y2S.

The main frame MF and the secondary frame SM have openings MWO and SWO which are formed at positions opposed to the opening WMIO of the stage Y2S when it is moved to its lowermost position. A prealignment stage MPS is provided to prealign a wafer WF. A wafer WF having been prealigned is introduced into the stage Y2S and held by the stage θZS, by attraction, by means of a vacuum buffer chamber, a handler and the like, all of which are not shown in the drawing. A mask MK is introduced into the stage Y2S and is held by the stage 74 S, in a similar manner.

After loading of the mask and the wafer, the stage Y2S is moved upwardly to a predetermined exposure station and, if necessary, the mask-to-wafer alignment is executed prior to the initiation of the upward movement of the stage Y2S. In this mask-to-wafer alignment, one of different portions of the wafer WF surface (namely, one of plural shot areas on the wafer) is aligned with the circuit pattern of the mask MK. After the stage Y2S is placed at the exposure station, the wafer exposing radiation EX which is a beam of parallel rays is projected upon the mask MK, whereby the one shot area of the wafer WF is exposed to the circuit pattern with the radiation. Thereafter, the remaining shot areas of the wafer WF are placed, in sequence, at the exposure station by the step-and-repeat movement of the stages XS and Y1S. In this manner, all the shot areas of the wafer WF are exposed to the circuit pattern of the mask MK in the step-and-repeat fashion.

During each exposure, the stage Y2S is moved upwardly or downwardly at a constant speed, such that the mask MK and the wafer WF are moved as a unit in a vertical direction (Y-axis direction). As a result, each shot area on the wafer WF is scanningly exposed to the mask MK pattern with the parallel-beam radiation EX. After exposures of all the shot areas on the wafer WF are completed, the stage Y2S is moved downwardly to its lowermost position, and the wafer WF and/or the mask MK is replaced by the next wafer and/or mask. It should be noted that the stage Y2S, as described, has a conveying function for conveying the mask MK and/or the wafer WF as well as a constant-speed feeding function for moving the mask and the wafer during each exposure.

At the time of movement of the stage Y2S, the stage Y1S is locked by the locking mechanism Y1PC with respect to the Y-axis direction. Also, the stage XS is locked with respect to the X-axis direction by means of a locking mechanism (not shown) which is similar to the locking mechanism Y1PC. Further, the stage θZS and/or the stage θS is locked with respect to the moving directions by means of a servo-locking mechanism, not shown. By doing so, all the stages can move with certainty and independently of each other, without mutual interference.

Further, at the time of movement of the stage Y2S, the steel belts Y1SL and Y1SR are locked by means of the locking mechanisms Y1PL and Y1PR, respectively. As a result, any variation in the tension of each constant-tension spring mechanism Y1BL or Y1BR acts only upon the stage Y2S and is not transmitted to the stage Y1S. Therefore, it is possible to maintain a fixed positional relation between the stage Y1S and the stage Y2S. This is preferable.

Figure 2:
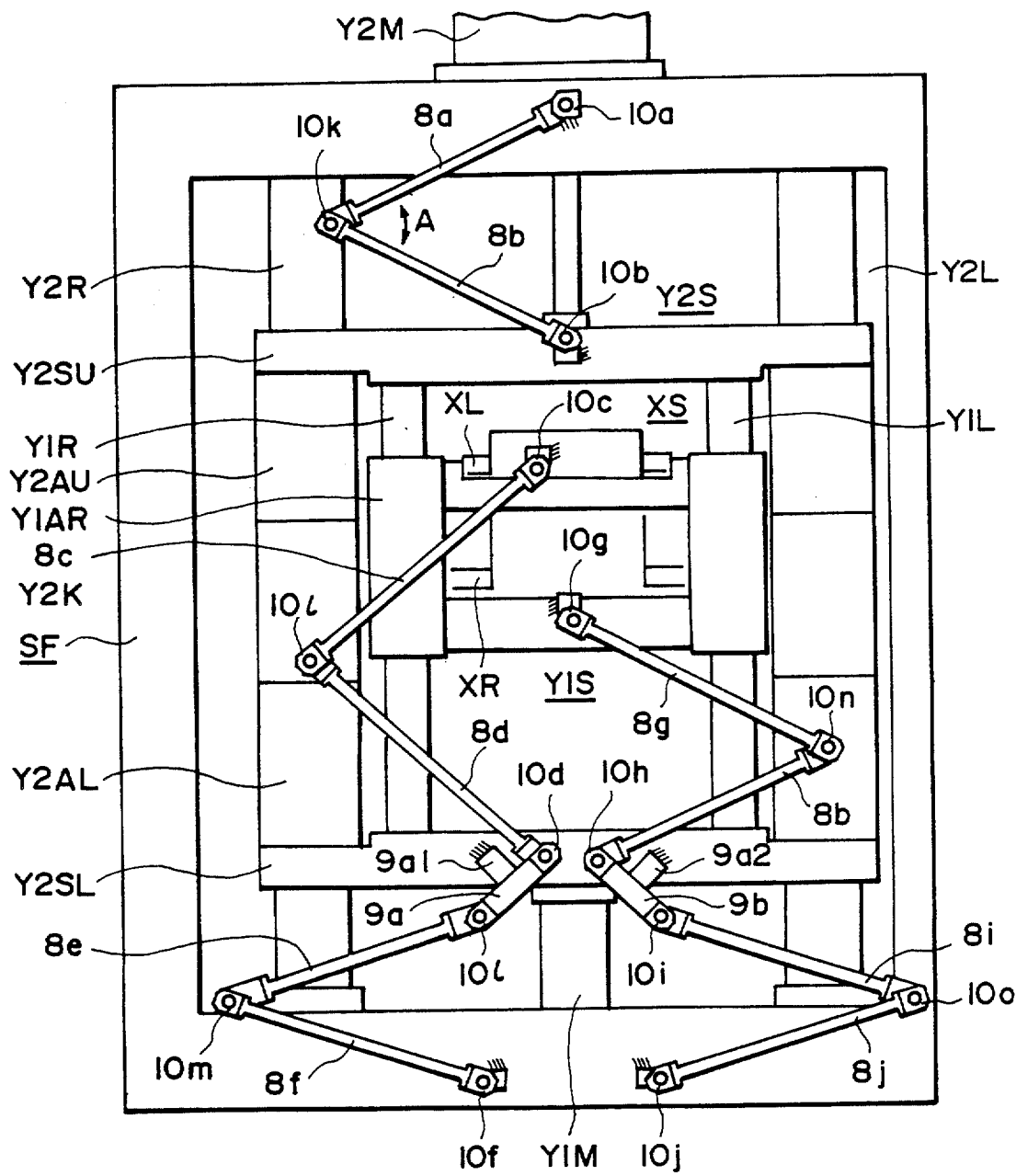
FIG. 2 is a schematic view showing the back of the stage device of the FIG. 1 embodiment.

FIG. 2 is a schematic view showing the back of the stage device of the FIG. 1 embodiment.

As shown in FIG. 2, the stage device includes piping arms 8a–8j each made of a stainless material, and relay blocks 9a and 9b each made of an aluminum material otherwise. Each relay block has formed therein four bores, defining four lines (which will be described later), corresponding to four bores formed in each of the piping arms 8c–8f, or 8g–8j. Additionally, there are provided rotary joints 10a–10o each having a rotating function by which a piping arm coupled thereto is made swingable about the rotary joint. Each rotary joint has formed therein four bores corresponding to four lines. The rotary joints 10a–10j and the relay blocks 9a and 9b are mounted to the secondary frame SF, the stage XS, the stage Y1S or the stage Y2S. On the other hand, the rotary joints 10k–10o are floating. As seen from FIG. 2, the piping to the tables of the stage device is assured by the combination of the piping arms 8a–8j, the relay blocks 9a and 9b and the rotary joints 10a–10o. The rotary joints 10a, 10f and 10j mounted to the secondary frame SF are made in fluid communication with an air-pressure supply source, not shown, disposed outside the vacuum ambience by way of fixed bores, not shown, formed in the secondary frame SF.

The stage Y2S and the secondary frame SF are made in fluid communication with each other by means of the piping arms 8a and 8b and the rotary joints 10a, 10b and 10k, such that an air pressure can be supplied from the outside of the vacuum chamber into fixed bores, not shown, formed in the stage Y2S. When the scan table (i.e. stage Y2S) moves, each rotary joint is rotatable such that the piping arms 8a and 8b are movable to open such as denoted by an arrow A. As a result, the interval between the rotary joints 10a and 10b can be expanded and contracted smoothly. As a consequence, upon movement of the stage Y2S, there is no resistance by the piping arms due to the returning force or otherwise.

The secondary frame SF is made in fluid communication with the stage XS by means of the piping arms 8c–8f, the rotary joints 10c, 10l, 10d, 10e, 10m and 10f and the relay block 9a which has a structure similar to each piping arm and which is fixed to the stage Y2S by way of a fixed portion 9al, such that an air pressure can be supplied from the outside of the vacuum chamber into fixed bores, not shown, formed in the stage XS. At the time of movement of the stage XS and the stage Y1S the, interval between the joints 10c and 10f can be expanded and contracted smoothly. Since the relay block 9a is fixed to the stage Y2S, the piping arms between the relay block 9a and the joint 10c are held immovable during movement of the stage Y2S. As a result, any adverse effect upon the attitude accuracy between the stage Y2S and the stage XS, which might be otherwise caused by the movement of these piping arms, can be prevented.

The stage Y1S and the secondary frame SF are made in fluid communication with each other by means of the piping arms 8g, 8h, 8i and 8j, ; the rotary joints 10g, 10n, 10h, 10i, 10o and 10j, and the relay block 9b which has a structure similar to each piping arm and which is fixed to the stage Y2S by way of a fixed portion 9a2. Thus, the interval between the joints 10g and 10j can be expanded and contracted smoothly at the time of movement of the stage Y1S. Also, similarly to the case of the stage XS, the fixation of the relay block 9b to the stage Y2S is effective to hold, immovable, the piping arms between the relay block 9b and the joint 10g during movement of the stage Y2S. Accordingly, the attitude accuracy between the stage Y2S and the stage Y1S is not adversely affected by the movement of the stage Y2S.

With the above-described piping arrangement, gaseous fluids are supplied to the stages XS, Y1S and Y2S independently of each other and then flow through fixed bores, not shown, formed in these stages toward the air bearing assemblies provided for guiding the movements of these stages. The gaseous fluid discharged from each air bearing assembly flows through a different fixed bore or bores, not shown, and is exhausted by way of the above-described piping arrangement.

Figures 3A, 3B:
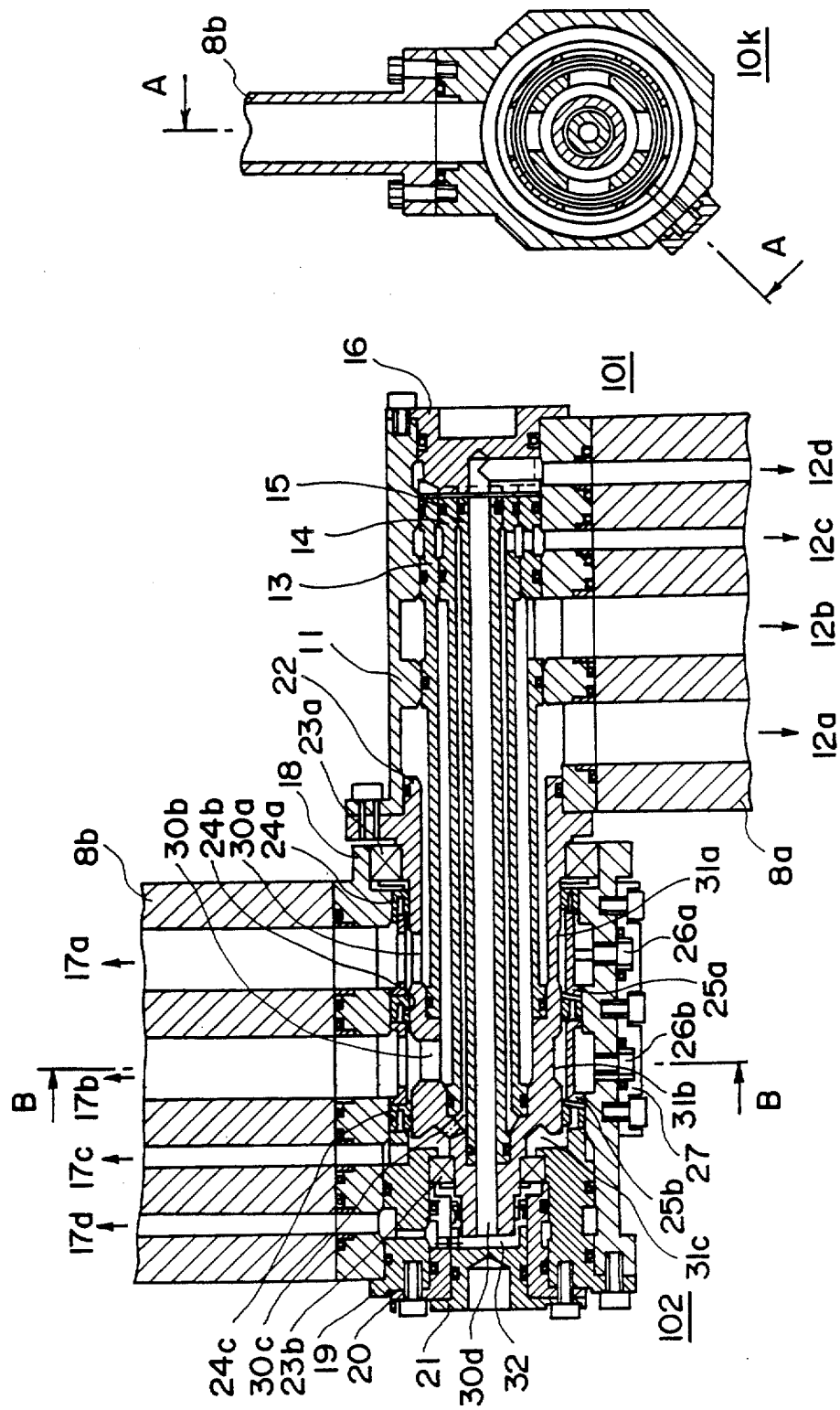
FIGS. 3A and 3B are sectional views, respectively, showing details of a rotary joint usable in the FIG. 1 embodiment.

FIGS. 3A and 3B shows details of the rotary joint 10k. FIG. 3A is a longitudinal section and FIG. 3B is a cross section. The other rotary joints have similar structures as that illustrated in these figures. Denoted as 11 in FIGS. 3A and 3B is a housing having four connecting ports 12a–12d. The housing 11 cooperates with a hollow shaft 22 to provide a hollow tubular member. Within such tubular member, three inner pipes 13, 14 and 15 having different diameters are accommodated. One end of the housing 11 is closed by a cap 16, such that four gas passageways are formed concentrically within the tubular member to thereby provide four passage lines. Another housing 18 having four connecting ports 17a–17d extends to cover the hollow shaft 22 and is coupled as a unit with the housing 11. One end of the housing 18 is closed by caps 19, 20 and 21, such that four-line gas passageways are formed in the housing 14 which passageways are coupled to the connecting ports 17a–17d, respectively. Of the four-line passageways, one passageway is used to supply gaseous fluid to one or more air bearing assemblies. The remaining three passageways are used to exhaust the gaseous fluid discharged from the air bearing assembly or assemblies. A first subassembly 101 having four-line gas passageways defined by the housing 11, the inner pipes 13–15 and the hollow shaft 22 and a second subassembly 102 having four-line gas passageways defined by the housing 18 and the caps 19–21, are coupled to each other for relative rotational motion. Also, the first and second subassemblies are coupled so that the four-line passageways of one of them are communicated with the four-line passageways of the other, respectively. In order to prevent gas leakage from the rotatable connection between the first and second subassemblies, and also in order to prevent fluid communication between the passageways in each subassembly, suitable sealing means such as Teflon seals 24a, 24b and 24c are provided. Further, in order to prevent interception of the communication between each of the connecting ports 17a–17d and between corresponding one of communication bores 30a–30d, formed in the outer peripheral portion of the hollow shaft 22, which interception might be caused by the rotation of the housing 18 relative to the housing 11, there are provided circumferentially extending grooves 31a–31c and a gas reservoir 32 which are formed at the outer periphery of the hollow shaft 22. Namely, during such a relative rotation, each of the communication ports 30a–30d can be retained in fluid communication with corresponding one of the connecting ports 17a–17d by way of a corresponding one of the circumferential grooves 31a–31c or the reservoir 32.

It should be noted that in the illustrated arrangement the cross-sectional area of each of the four-line concentric gas passageways is made equal to the cross-sectional area of a corresponding one of the four connecting ports formed in the housing 11 or 18, so as to prevent reduction of gas supply/exhaustion efficiency due to a loss such as fluid resistance or otherwise. The Teflon seals 24a–24c are mounted so as not to be dislocated in the axial direction, by means of keeping rings 25a and 25b fixed by suitable means such as bolts 26a and 26b. Any gas leakage from the fixing bolts 26a and 26b are prevented by a cap 27 having O-ring seals.

The piping arms 8a and 8b are coupled, by suitable fixing means, to the illustrated rotary joint 10k so that their four-line bores are aligned with respective connecting ports 12a–12d or 17a–17d. At the rotary joints 10a, 10b, 10c, 10f, 10g and 10j, either the first subassembly 101 or the second subassembly 102 is fixed to the frame or stage, and the fixed subassembly is connected with fixed bores formed in the frame or stage, in place of the bores of the piping arm. With the above-described structure, the first subassembly 101 and the second subassembly 102 are relatively rotatable with ball bearings 23a and 23b intervening therebetween. Accordingly, each piping arm is swingable about a corresponding rotary joint. Further, such a swingable movement of the piping arm does not cause leakage of gaseous fluid or otherwise.

In place of the piping arm arrangement of the present embodiment, four separate pipes may be used. Namely, for each of the four-line passageways, one connecting pipe may be used. As the material of the piping arm, aluminum, ceramics or otherwise may be used. This is preferable to reduce the weight.

In accordance with the present embodiment, as has hitherto been described, the operating fluid such as a gaseous fluid can be supplied to a movable member such as an air slider or otherwise, without damaging a vacuum ambience. Also, the supplied operating fluid can be exhausted from the movable object, without damaging the vacuum ambience. Moreover, the movement of the movable object itself is not adversely affected by the supply/exhaustion of the operating fluid, e.g. by the resistance caused by the piping arrangement.

Figure 4:
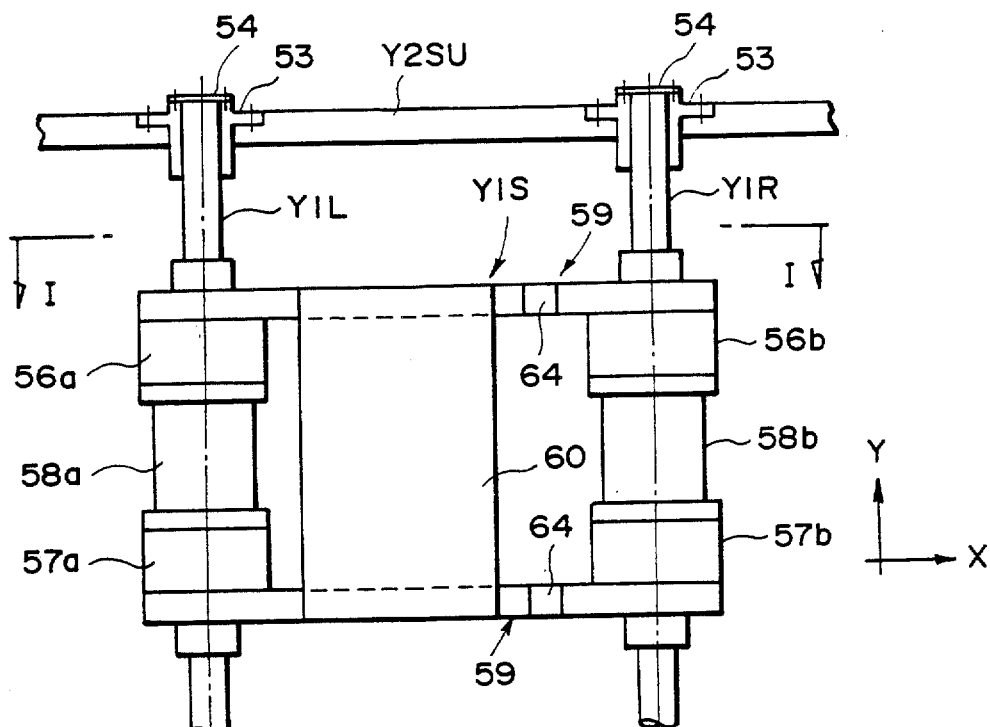
FIG. 4 is a front elevational view showing details of a guide mechanism usable in the FIG. 1 embodiment.
Figure 5:
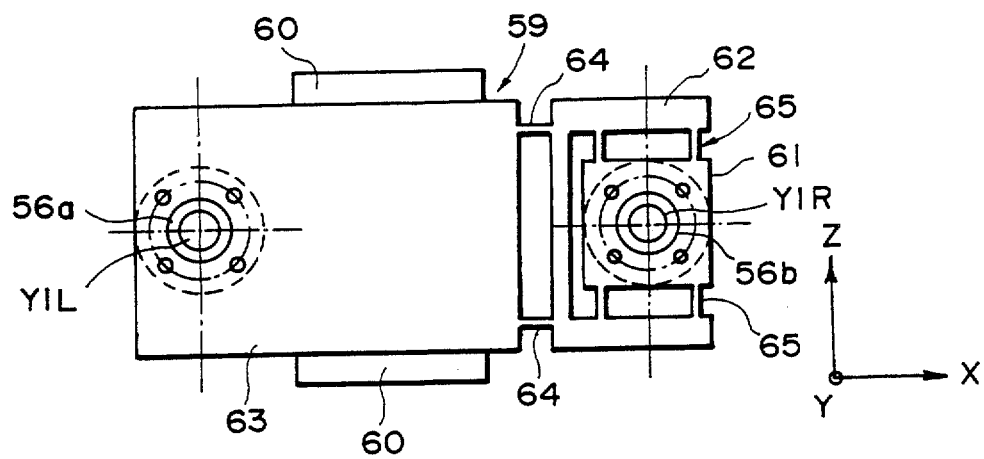
FIG. 5 is a sectional view of the guide mechanism taken on a line I—I in FIG. 4 and as viewed in the direction of an arrow.

Referring now to FIG. 4, there is shown a generally vertically extending and rectilinearly movable stage which is usable as the stage Y1S or Y2S shown in FIG. 1. FIG. 5 is a sectional view, taken on a line I—I in FIG. 4 and as viewed in the direction of an arrow. Description will be made to an example wherein the rectilinearly movable stage shown in FIGS. 4 and 5 is used as the stage Y1S of the FIG. 1 embodiment.

Two parallel guide bars Y1R and Y1L are fixedly mounted to the upper plate Y2SU of the stage Y2S. Each of the guide bars Y1R and Y1L is mounted to the upper plate Y2SU by means of a holding sleeve 53 having a flange. One end of each sleeve 53 is provided with a keeping plate 54 which prevents extrusion of the end portion of the guide bar. The vertically movable stage Y1S is mounted on the guide bars Y1R and Y1L for upward and downward movement in the Y-axis direction along these bars. Two air bearing assemblies 56a and 57a are slidably mounted on the guide bar Y1L, and these bearing assemblies 56a and 57a are coupled to each other by a coupling barrel 58a. Similarly, two air bearing assemblies 56b and 57b coupled by a coupling barrel 58b are slidably mounted on the guide bar Y1R. Thus, the stage Y1S is formed by the bearing assemblies 56a, 56b, 57a and 57b, two coupling plates 59 and 59 each coupling upper bearing assemblies 56a and 56b or lower bearing assemblies 57a and 57b, the coupling barrels 58a and 58b each coupling two bearing assemblies on the same guide bar, and a stage base 60 mounted to the upper and lower coupling plates 59 and 59.

As is best seen in FIG. 5, each coupling plate 59 is provided by a first member 61, a second member 62 and a third member 63. The first member 61 is adapted to hold the bearing assembly 56b slidably mounted on the guide bar Y1R, while the third member 63 is adapted to hold the bearing assembly 56a slidably mounted on the other guide bar Y1L. The first member 61 and the second member 62 are coupled to each other via two-sets of parallel leaf springs 65, each being resiliently deformable in a plane perpendicular to the axial direction of the guide bar and in the directions along the X-axis shown in FIG. 5. The second member 62 and the third member 63 are coupled to each other via a pair of parallel leaf springs 64 which are resiliently deformable in the direction along the Z-axis which is perpendicular to the X-axis. As best seen in FIG. 6, each of the leaf springs 64 and 65 is formed by an element which is integral with the first and second members 61 and 62 or the second and third members 62 and 63, constituting the coupling plates 59. In FIG. 6, only one leaf spring 64 deformable in the Z-axis direction is illustrated. Of the two guide bars Y1R and Y1L, one (Y1L) has been machined and mounted with very high precision, so that it can be used as a guiding reference for the rectilinear motion of the stage.

In the rectilinear motion stage having the arrangement described above, the stage Y1S is moved upwardly or downwardly along the Y-axis, with the bearing assemblies 56a, 56b, 57a and 57b sliding on the guide bars Y1R and Y1L. If, at this time, the two guide bars Y1R and Y1L are not exactly parallel to each other, such an error in the parallelism is absorbed by the flexible structure comprising the leaf springs 65 resiliently deformable in the X-axis direction and the leaf springs 64 resiliently deformable in the Z-axis direction. As a result, smooth rectilinear motion of the stage Y1S is assured. If, for example, the guide bar Y1R is inclined in the X-axis direction relative to the guide bar Y1L, the leaf springs 65 follow such inclination whereby they are resiliently deformed in the X-axis direction. As a result, the bearing assemblies 56b and 57b can slide on the guide bar Y1R smoothly. If, on the other hand, the guide bar Y1R is inclined in the Z-axis direction relative to the guide bar Y1L, the parallel leaf springs 64 follow such inclination whereby they are resiliently deformed in the Z-axis direction, such that the bearing assemblies 56b and 57b can slide on the guide bar Y1R smoothly. Additionally, even when the guide bar Y1R is inclined both in the X-axis direction and the Z-axis direction, leaf springs 64 and 65 are resiliently deformed to thereby allow smooth sliding movement of the bearing assemblies 56b and 57b on the guide bar Y1R.

Figure 7:
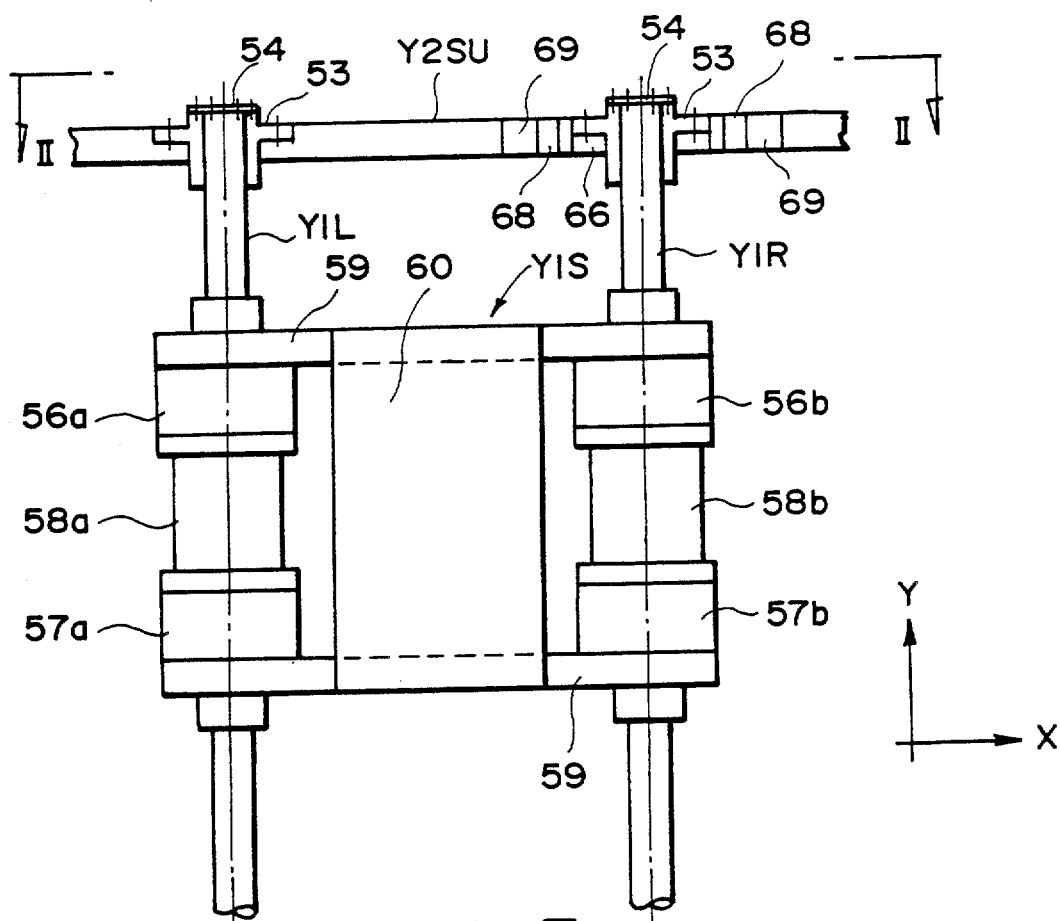
FIG. 7 shows another example of the guide mechanism usable in a stage device according to the present invention.
Figure 8:
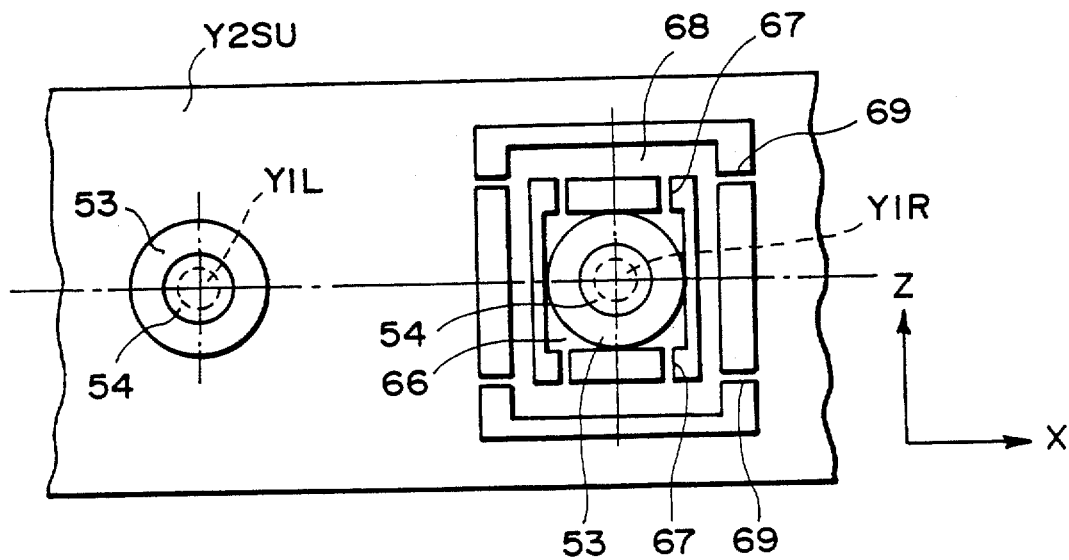
FIG. 8 is a sectional view of the guide mechanism, taken on a line II—II in FIG. 7 and as viewed in the direction of the arrows.

FIG. 7 shows another embodiment of a rectilinear motion stage which is usable as the stage Y1S, for example. FIG. 8 is a top plan view of the rectilinear motion stage, as viewed in the direction denoted by an arrow II—II in FIG. 8. In this embodiment, the flexible coupling structure for absorbing any error in the parallelism between the two guide bars and comprising parallel leaf springs each being resiliently deformable in the X-axis direction or the Z-axis direction, is provided on the upper plate Y2SU and the lower plate Y2SL of the stage Y2S (see FIG. 1). The flexible coupling structure provided on the upper plate Y2SU will now be described, as an example.

One of the guide bars, denoted at Y1R, is held by a first member 66 which is coupled to a second member 68 via sets of parallel leaf springs 67, each being resiliently deformable in the X-axis direction. The second member 68 is coupled to the upper plate Y2SU via two sets of parallel leaf springs 69, each being resiliently deformable in the Z-axis direction. With this arrangement, the guide bars Y1R and Y1L themselves can flexibly dislocate with the movement of the stage Y1S so as to absorb any error caused during manufacture or assembly of the guide bars Y1R and Y1L or the coupling plates 59. In this example, there is no necessity of providing a flexible coupling structure for the coupling plates 59 which are provided to couple the bearing assemblies 56a, 56b, 57a and 57b. The remaining portion of this embodiment is similar to that of the foregoing embodiment, in respect to the structure, the operation and the function.

In the embodiments shown in FIGS. 4-8, each of the leaf springs constituting the flexible coupling structure is formed by an element which is integral with the coupling plate 59 or the upper plate Y2SU. However, in place of using such integral structure, each leaf spring may be formed by a separate element attached, by suitable means, to the coupling plate 59, the upper plate Y2SU or the lower plate Y2SL.

For the mounting of each of the guide bars Y1R and Y1L to the frame (upper plate Y2SU), it may be mounted by use of a resiliently deformable member such as, for example, a metal diaphragm or otherwise which is resiliently deformable in the axial direction of the guide bar Y1R or Y1L (i.e. in the Y-axis direction). When such an axially deformable resilient means is used to mount the guide bar to the frame, any deformation of the frame or the guide bar due to heat stress or vibration or otherwise can be absorbed by the axial deformation of such resilient means. As a result, it is possible to prevent an unwanted force from being applied to the neighboring elements.

In accordance with this aspect of the present invention, as has been described, two guide bars are coupled via a flexible structure, which can absorb any error in the parallelism between the two guide bars or any error between the interval of the two guide bars and the interval of two bearing assemblies coupled by a coupling plate, which might be caused by a dimensional error at the time of machining or assembling or by the deformation due to external factors such as heat, vibration or otherwise after the assembling. As a result, smooth rectilinear motion of the stage is ensured with certainty. Further, the manufacture of the stage device is facilitated because very high precision is not required during the machining and the assembling.

Referring now to FIGS. 9 and 10, there is shown an electrically actuated drive cylinder which is usable as the driving mechanism Y1M, Y2M or XM shown in FIG. 1. FIG. 9 is a longitudinal section of the drive cylinder, and FIG. 10 is a cross section, taken on a line III—III in FIG. 9. As an example, description will be made to a case where the drive cylinder is used as the driving mechanism Y1M of the FIG. 1 embodiment.

The driving mechanism Y1M includes a rectilinearly movable rod Y1G coupled to the stage Y1S, a feed screw means (details of which will be described later) for causing reciprocating movement of the rectilinear motion rod Y1G in its axial direction (Y-axis direction), and a motor 101 for driving such feed screw means. The driving mechanism portion comprising the feed screw means, the motor 101 and the like are accommodated in a closed container 201. The container 201 is formed by a cylindrical casing 116, flange members 117 and 119 provided at the opposite ends of the casing 116, a cover 118, an electric terminal unit 125 for wiring, provided as a portion of the casing 116, and vacuum seals 120, 121, 123, 124 and 126 for sealing various connections between various elements. The rectilinear motion rod Y1G extends through the flange member 119 with the seal 124 interposed therebetween, and is made slidable relative to the flange member 119 in the Y-axis direction. The motor 101 is fixedly secured to the flange member 117 and has an output shaft. A gear 102a is fixed to the tip end of the output shaft of the motor 101. The flange member 117 provides a bearing casing for a feed screw shaft 103, and receives the feed screw shaft 103 with the aid of bearings 109a and 109b mounted to the flange member 117. These bearings 109a and 109b are secured to the flange member 117, while holding the feed screw 103, by the keeping screws 111 and 112. A gear 102b is fixed to one end portion of the feed screw shaft 103. The gear 102b is in mesh engagement with the gear 102a provided at the motor 101 side. The feed screw shaft 103 has a threaded portion 103a on which the nut 104 is mounted. The nut 104 is fixedly secured to a flange formed at an end portion of the rectilinear motion rod Y1G by means of bolts (not shown). The rectilinear motion rod Y1G has a bore 105 having a diameter and an axial length just allowing insertion of the threaded portion 103a thereinto in the axial direction. Rollers 113a and 113b, each of which functions as a cam follower, are mounted to the rectilinear motion rod Y1G. These rollers 113a and 113b are disposed within a guide rail 114 fixedly mounted to the flange members 117 and 119 and having a channel-like shape in cross section. Disposed at the inside surface of the guide rail 114 is a keeping leaf spring 122 effective to apply a predetermined pressure to each of the rollers 113a and 113b. The rollers 113a and 113b and the guide rail 114 cooperate with each other to provide a rotation preventing means for the nut 104 and the rectilinear motion rod Y1G. The flange member 119 is provided with a slide bearing 110 and a vacuum seal 124, as a bearing means for the rectilinear motion rod Y1G. Disposed at the right hand of the guide rail 114 are sensors 115a and 115b for detecting an origin of the movable range of the rectilinear motion rod Y1G and any overrun of the rod Y1G at the end portion of the movement thereof.

Mounted to the flange member 119 are a multi-layered-type piezoelectric device 107 and a chucking member 108 having a suitable clearance maintained between it and the outer peripheral surface of the rectilinear motion rod Y1G. The piezoelectric device 107 and the chucking member 108 cooperate with each other to selectively lock the rectilinear motion rod Y1G. For radiation of heat by use of a medium such as a cooling air or the like, which heat might be caused by the motor and the like contained in the container 201, a cooling medium supply tube 129 for supplying a cooling medium such as an air is connected to the flange member 119 and, on the other hand, an exhaust tube 130 is connected to the flange member 117 for the exhaustion of the cooling medium. The flange member 119 of the driving mechanism YSM is fixed to a base member 128 with a heat-insulating material 127 interposed therebetween. The movable stage Y1S which is a movable member to be driven is coupled to the tip end of the rectilinear motion rod Y1G.

The driving mechanism YSM having the above-described structure is placed in a vacuum ambience and operates in the following manner. When the motor 101 is actuated, the gear 102a fixed to the tip end of the output shaft of the motor 101 rotates and such rotational motion is transmitted to the feed screw shaft 103 via the gear 102b. Since the nut 104 engaging the threaded portion 103a of the feed screw shaft 103 is held unrotatable by the cooperation of the rollers 113a and 113b and the guide rail 114, the rotation of the threaded portion 103a causes rectilinear movement of the nut 104 along the guide rail 114 As a result, the rectilinear motion rod Y1G to which the nut 104 is fixed moves rectilinearly along the Y-axis in accordance with the rotation of the threaded portion 103a. Accordingly, the movable stage Y1S disposed in a vacuum ambience moves in the Y-axis direction. When the stage Y1S reaches a predetermined or desired position, the piezoelectric device 107 is actuated to press the chucking member 108 to cause it to fasten the rectilinear motion rod Y1G. By this, the rod Y1G is locked. During such an operation made in the vacuum ambience, the interior of the closed gas-tight container 201 is maintained at an atmospheric pressure. Since a vacuum seal such as at 124 is provided in the opening of the flange member through which the rectilinear motion rod Y1G penetrates, the gas-tight property of the container 201 is not damaged. The heat generated within the container 201 by the motor 101 and the like is radiated to the outside of the container by flowing the cooling medium such as an air from the supply tube 129 into the container 201 and then to the exhaust tube 130. Additionally, it should be noted that the container 201 is fixed to the lower plate Y2SL of the stage Y2S with a heat insulating material 127 interposed therebetween. As a result, the transmission of the heat generated within the container to the lower plate Y2SL, exposed to the vacuum ambience, is sufficiently prevented.

Figure 11A:
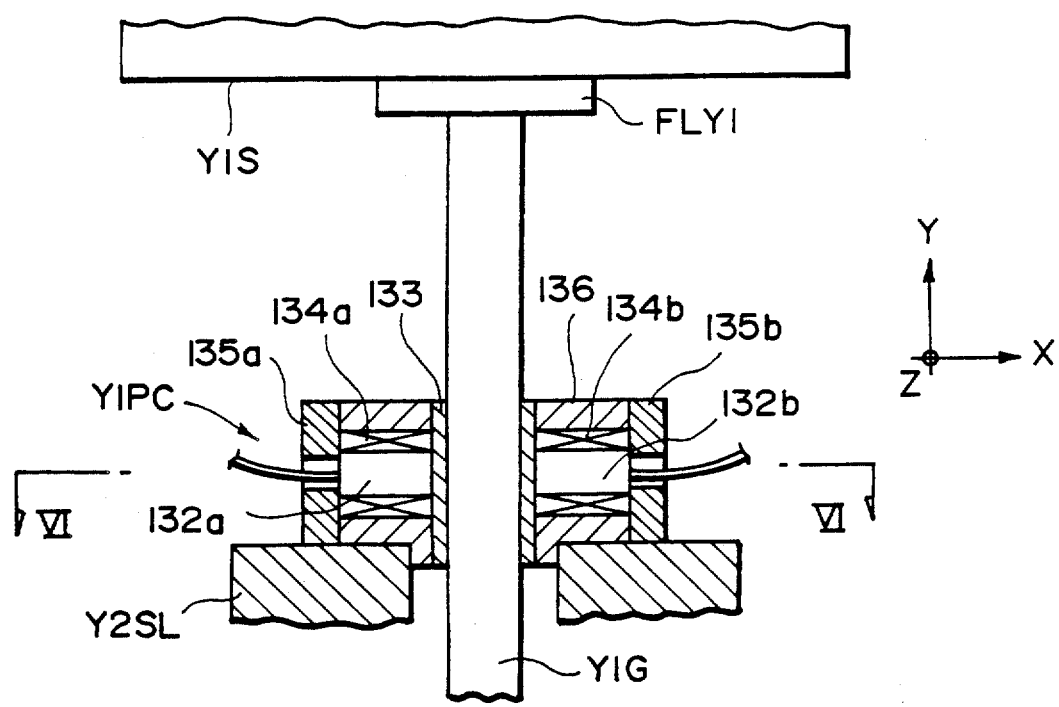
FIGS. 11A and 11B are sectional views, respectively, showing details of a mechanical locking mechanism usable in the stage device of the FIG. 1 embodiment.
Figure 11B:
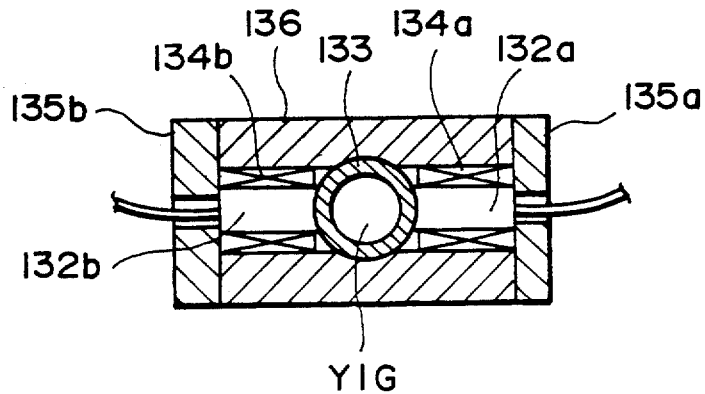

Referring now to FIGS. 11A and 11B, there is shown a locking mechanism which is usable as the locking mechanism Y1PC of the FIG. 1 embodiment and which is adapted to lock the stage Y1S more tightly. Of these figures, FIG. 11A is a longitudinal section of the locking mechanism, while FIG. 11B is a cross section taken on a line VI—VI in FIG. 11A. The locking mechanisms of the FIG. 1 embodiment, other than the locking mechanism Y1PC, may have substantially the same structure.

As shown in FIGS. 11A and 11B, one end of a locking bar Y1G is coupled to the movable stage Y1S, so that the bar Y1G is movable in the Y-axis direction with the movable stage Y1S. Multilayered-type piezo-electric devices 132a and 132b are used to tighten a chucking member 133 to thereby block the movement of the locking bar Y1G relative to the lower plate Y2SL of the stage Y2S. The piezoelectric devices 132a and 132b are held by two fixed holding members 134a and 134b and are mounted on a housing 136. Denoted at 135a and 135b are covers. The housing 136 is fixedly secured to the lower plate Y2SL.

In operation of the locking mechanism Y1PC having the above-described structure, and after the movable stage Y1S reaches a desired position, the piezoelectric devices 132a and 132b are actuated to cause the chucking member 133 to fasten the locking bar Y1G. By this, the locking bar Y1G is held fixed relative to the lower plate Y2SL and whereby the movable stage Y1S is locked to the stage Y2S.

In the driving mechanism according to these embodiments of the present invention, as has hitherto been described, a drive source and a drive transmitting mechanism are kept in a closed container having gas-tightness. Therefore, the interior of the container can be maintained at an atmospheric pressure when the movable stage is driven by the drive source and the drive transmitting mechanism. Accordingly, an ordinary lubricating agent or otherwise can be used without difficulties, such that smooth operation and high positioning accuracy are ensured. Additionally, the lifetime of the device can be prolonged. Further, it becomes possible to use a screw mechanism as the feeding means. As a result, the device can be made compact and light in weight. Additionally, high-precision positioning control is facilitated.

While in the present embodiment an electrically actuated motor is used as a drive source, a hydraulically actuated drive source such as a pneumatically actuated air motor or otherwise may be used. It should be noted that the driving mechanism of the present invention is not limited to one used as a means for moving a movable stage. For example, the driving mechanism is usable in many fields of art as a rectilinear-motion type actuator placed in a vacuum ambience.

While the invention has been described with reference to the structures disclosed herein, it is not confined to the details set forth and this application is intended to cover such modifications or changes as may come within the purposes of the improvements or the scope of the following claims.

What is claimed is:

1. A stage device for moving a stage substantially in a direction of gravity, said device comprising:
   a guide mechanism for guiding the stage substantially in the direction of gravity;
   a driving mechanism for moving the stage substantially in the direction of gravity; and
   a balancing mechanism for effecting gravity compensation of the stage with respect to movement of the stage, said balancing mechanism including a belt having an end fixed to the stage and a constant-tension spring mechanism for acting on said belt.

2. A device according to claim 1, further comprising a locking mechanism for locking the stage and preventing the stage from moving substantially with respect to the direction of gravity, said locking mechanism being effective to grasp said belt.

3. A stage device for moving a stage substantially in a direction of gravity, said device comprising:
   a guide mechanism for guiding the stage substantially in the direction of gravity;
   a driving mechanism for moving the stage substantially in the direction of gravity; and
   a balancing mechanism for effecting gravity compensation of the stage with respect to movement of the stage,
   wherein said driving mechanism includes an electric motor, a rod having an end fixed to the stage and a gear mechanism cooperable with said electric motor to move said rod substantially in the direction of gravity.

4. A device according to claim 3, wherein said driving mechanism further includes a cover which is effective to place said electric motor and said gear mechanism in a gas-tight state space.

5. A device according to claim 3, wherein an end of said rod is coupled to the stage via a resilient member.

6. A stage device for moving a stage substantially in a direction of gravity, said device comprising:
   a guide mechanism for guiding the stage substantially in the direction of gravity;
   a driving mechanism for moving the stage substantially in the direction of gravity; and
   a balancing mechanism for effecting gravity compensation of the stage with respect to movement of the stage,
   wherein said guide mechanism includes a fluid bearing formed integrally with the stage, a plurality of pipes provided in relation to said fluid bearing and a coupling mechanism for coupling one pipe with another so that said one pipe is rotationally movable relative to the other.

7. A device according to claim 6, wherein each pipe has a first passageway for supplying the fluid to said fluid bearing and a second passageway for discharging the fluid from said fluid bearing.

8. A stage device for moving a stage substantially in a direction of gravity, said device comprising:
   a guide mechanism for guiding the stage substantially in the direction of gravity;
   a driving mechanism for moving the stage substantially in the direction of gravity; and
   a balancing mechanism for effecting gravity compensation of the stage with respect to movement of the stage,
   wherein said guide mechanism includes a plurality of guide shafts, a first coupling plate for coupling said guide shafts in a predetermined relationship, a plurality of fluid bearings provided in relation to said guide shafts, respectively, and a second coupling plate for coupling said fluid bearings into a predetermined relationship.

9. A device according to claim 8, wherein said first coupling plate has a resiliently deformable portion between said guide shafts.

10. A device according to claim 8, wherein said second coupling plate has a resiliently deformable portion between said fluid bearings.

11. A stage device, comprising:
    first and second movable stages;
    a first guide mechanism for guiding said first stage substantially in the direction of gravity;
    a second guide mechanism for guiding said second stage relative to said first stage and in a direction different from the direction in which said first stage is guided by said first guide mechanism;
    a balancing mechanism for effecting gravity compensation of said first stage with respect to movement of said first stage;

a first structure for supporting said first guide mechanism; and a second structure, separate from said first structure, for supporting said balancing mechanism.

12. A stage device for moving a stage substantially in a direction of gravity, said device comprising:

a guide mechanism for guiding the stage substantially in the direction of gravity;

a balancing mechanism for effecting gravity compensation of the stage with respect to movement of the stage;

a first structure for supporting said guide mechanism; and a second structure, separate from said first structure, for supporting said balancing mechanism.

13. A stage device, comprising:

first, second and third movable stages;

a first guide mechanism for guiding said first stage substantially in a direction of gravity;

a second guide mechanism for guiding said second stage relative to said first stage, substantially in the direction of gravity;

a third guide mechanism for guiding said third stage relative to said second stage, in a direction different from the direction in which said first or second stage is guided by said first or second guide mechanisms;

a first balancing mechanism for effecting gravity compensation of said first stage with respect to movement of said first stage; and a second balancing mechanism for effecting gravity compensation of said second stage with respect to the direction of movement of said second stage.

14. A stage device for moving a stage substantially in a direction of gravity, said device comprising:

a guide mechanism for guiding the stage substantially in the direction of gravity;

a balancing mechanism for effecting gravity compensation of the stage with respect to movement of the stage; and a first structure for supporting said guide mechanisms; and a second structure, separate from said first structure, for supporting said balancing mechanism, wherein said first structure is suspended from said second structure.

15. A device according to claim 14, further comprising a driving mechanism fixed to said second structure, for moving the stage substantially in the direction of gravity.

16. A stage device, comprising:

first and second movable stages;

a first guide mechanism for guiding said first stage substantially in the direction of gravity;

a second guide mechanism for guiding said second stage relative to said first stage and in a direction different from the direction in which said first stage is guided by said first guide mechanism;

a balancing mechanism for effecting gravity compensation of said first stage with respect to movement of said first stage;

a first structure for supporting said first guide mechanism; and a second structure, separate from said first structure, for supporting said balancing mechanism.

wherein said first structure is suspended from said second structure

17. A stage device for moving a stage substantially in a direction of gravity, said device comprising:

a plurality of guide shafts;

a driving mechanism for moving the stage along said guide shafts, substantially in the direction of gravity;

a balancing mechanism for effecting gravity compensation of the stage with respect to the movement of the stage;

a first structure for supporting said guide shafts and said driving mechanism; and a second structure, separate from said first structure, for supporting said balancing mechanism.

18. A device according to claim 17, wherein said first structure is placed inside said second structure.

19. A device according to claim 18, wherein said second structure is effective to substantially confine said first structure in a predetermined ambience.

20. A stage device for moving a stage substantially in a direction of gravity, said device comprising a plurality of guide shafts;

a driving mechanism for moving stage along said guide shafts, substantially in the direction of gravity;

a balancing mechanism for effecting gravity compensation of the stage with respect to the movement of the stage;

a first structure for supporting said guide shafts and said driving mechanism; and a second structure for supporting said balancing mechanism, said second structure being effective to substantially confine said first structure in a predetermined ambience.

21. A stage device for moving a stage substantially in a direction of gravity, said device comprising:

a plurality of guide shafts;

a driving mechanism for moving the stage along said guide shafts, substantially in the direction of gravity;

a balancing mechanism for effecting gravity compensation of the stage with respect to the movement of the stage; and a structure for supporting said guide shafts and said driving mechanism;

wherein said driving mechanism has a motor, a rod having an end fixed to the stage, a gear mechanism cooperable with said motor to move said rod substantially in the direction of gravity, and a housing member for placing said motor, and said gear mechanism in a substantially gas-tight state space.

* * * * *

UNITED STATES PATENT AND TRADEMARK OFFICE
CERTIFICATE OF CORRECTION

PATENT NO. : 4,993,696

DATED : February 19, 1991

INVENTOR(S) : MOTOMU FURUKAWA, ET AL.

It is certified that error appears in the above-identified patent and that said Letters Patent is hereby corrected as shown below:

COLUMN 1

Line 15, "the" should be deleted.

COLUMN 6

Line 63, "Y1S" should read --Y1S,--.
    Line 64, "the," should read --the--.

COLUMN 7

Line 7, "; the" should read --the--.
    Line 31, "shows" should read --show--.
    Line 58, "caps 19-21, are" should read --caps 19-21 are--.

COLUMN 8

Line 24, "are" should read --is--.

COLUMN 12

Line 29, "114 As" should read --114. As--.

COLUMN 16

Line 29, "comprising" should read --comprising:--.

UNITED STATES PATENT AND TRADEMARK OFFICE
CERTIFICATE OF CORRECTION

PATENT NO. : 4,993,696

DATED : February 19, 1991

INVENTOR(S) : MOTOMU FURUKAWA, ET AL.

It is certified that error appears in the above-identified patent and that said Letters Patent is hereby corrected as shown below:

COLUMN 16

Line 32, "stage" should read --the stage--.

Signed and Sealed this

Twenty-second Day of September, 1992

Attest:

DOUGLAS B. COMER

Attesting Officer     Acting Commissioner of Patents and Trademarks